US006798886B1

(12) United States Patent
Smith et al.

(10) Patent No.: US 6,798,886 B1
(45) Date of Patent: Sep. 28, 2004

(54) METHOD OF SIGNAL SHREDDING

(75) Inventors: Jack W. Smith, Belle Haven, VA (US); Paul Reed Smith, Lothian, MD (US)

(73) Assignee: Paul Reed Smith Guitars, Limited Partnership, Stevensville, MD (US)

( * ) Notice: Subject to any disclaimer, the term of this patent is extended or adjusted under 35 U.S.C. 154(b) by 0 days.

(21) Appl. No.: 09/481,609

(22) Filed: Jan. 12, 2000

Related U.S. Application Data

(63) Continuation-in-part of application No. 09/430,293, filed on Oct. 29, 1999.
(60) Provisional application No. 60/106,150, filed on Oct. 29, 1998.

(51) Int. Cl.[7] .................................................. H03G 3/00
(52) U.S. Cl. ........................... 381/61; 381/58; 704/266; 84/608
(58) Field of Search ............................. 381/61, 58, 62, 381/77, 78, 73, 98–103; 84/600, 601–609, 622, 623; 704/278, 213, 266

(56) References Cited

U.S. PATENT DOCUMENTS

| | | | | |
|---|---|---|---|---|
| 5,048,390 A | * | 9/1991 | Adachi et al. ............ | 84/464 R |
| 5,231,671 A | | 7/1993 | Gibson et al. | |
| 5,430,241 A | | 7/1995 | Furuhashi et al. | |
| 5,675,709 A | * | 10/1997 | Chiba ......................... | 704/278 |

OTHER PUBLICATIONS

*An Approach for the Separation of Voices in Composite Musical Signals,* by Robert Crawford Maher, Doctor of Philosophy, University of Illinois at Urbana–Champaign.
Kyma: Computer Product for Resynthesis and Sound Manipulation, Sumbolic Sound Corp. (Champaign, IL).
Ionizer: Computer Product for Sound Morphing and Manipulation, Arboretum Systems, Inc. (Pacifica, N.Y.).
Harris C.M., Weiss M.R. (1963): "Pitch extraction by computer processing of high–resolution Fourier analysis data," J. Acoust. Soc. Am. 35, 339–335 [8.5.3].
Parsons T.W. (1976): "Separation of speech from interfering speech by means of harmonic selection," J. Acoust. Soc. Am. 60, 911–918.
Quatieri, T. (2002): "Discrete–time speech signal processing: Principles and practice," Prentice–Hall, Ch. 10.
Seneff, S. (1976): "Real–time harmonic pitch detector," J. Acoust. Soc. Am. 60 (A), S107 (Paper RR6; $92^{nd}$ Meet. ASA) [8.1;8.5.3].
Seneff, S. (1978): "Real–time harmonic pitch detector," IEEE Trans. ASSP–26, 358–364 [8.1;8.5.3;8.5.4].
Seneff, S. (1982): "System to independently modify excitation and/or spectrum of speech waveform without explicit pitch extraction," IEEE Trans. ASSP–30, 566–578 [9.4.4;9.4.5].
Frazier, R., Samsam, S., Braida, L., Oppenheim, A. (1976): "Enhancement of speech by adaptive filtering," Proc. IEEE Int'l Conf. on Acoust., Speech, and Signal Processing, 251–253.
Lim, J., Oppenheim, A., Braida, L. (1978): "Evaluation of an adaptive comb filtering method for enhancing speech degraded by white noise addition," IEEE Trans. ASSP–26(4), 354–358.
Hess, W. (1983): "Pitch determination of speech signals: Algorithms and devices," Springer–Verlag, 343–470.

* cited by examiner

*Primary Examiner*—Melur Ramakrishnaiah
(74) *Attorney, Agent, or Firm*—Barnes & Thornburg LLP

(57) ABSTRACT

Methods for identifying the harmonic content of a single signal contained within a more complex signal and subsequently processing or separating signals contained within a complex mixture of signals into their constituent parts. Also, a single signal may be selectively separated or removed from the more complex audio signal. Furthermore, it may be desired to affect or modify the volume, clarity, timbre, color, feel, understandability (e.g. vowel and consonant sounds), the punch or clarity of the attack phase of a note or of a sequence (sometimes rhythmic) of individual notes or sounds in a complex combination of sounds of differing frequencies, volumes, and time sequence patterns. Multiple methods are described herein to allow the identification of signals within an audio signal that contains multiple or mixed signals, such as an audio signal containing a mixture of several musical instruments and/or voices.

6 Claims, 10 Drawing Sheets

THE RESPONSE CURVE OF A VIOLIN CAN BE THOUGHT OF AS THE ACOUSTICAL FINGERPRINT OF THE INSTRUMENT. THIS SAMPLE SHOWS THE INPUT ADMITTANCE (VELOCITY AMPLITUDE PER UNIT DRIVING FORCE) AS A FUNCTION OF FREQUENCY AT THE BRIDGE IN THE BOWING DIRECTION. ALSO INDICATED ARE THE FUNDAMENTAL FREQUENCIES OF THE OPEN STRINGS, THE VERTICAL LINES MARKED G, D, A, E. THE VARIOUS PEAKS IN THE DIAGRAM SHOW THE ESSENTIAL PARAMETERS OF THE INSTRUMENT.

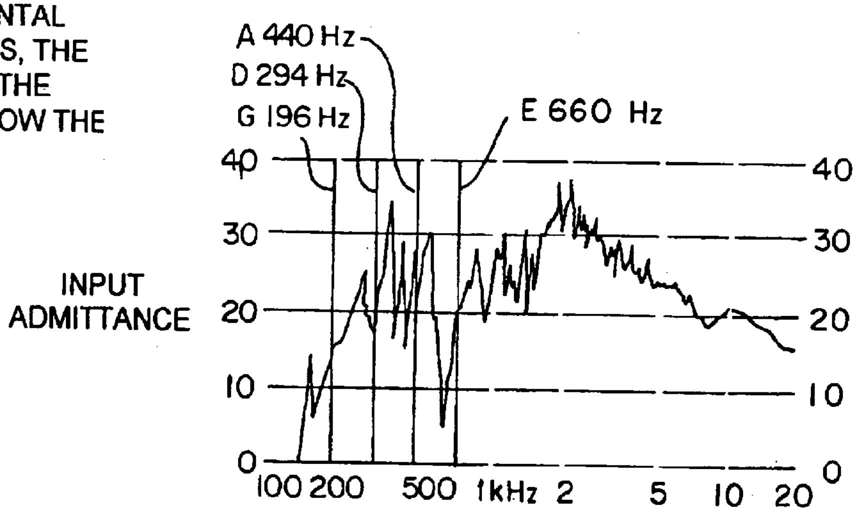

FIG. 1

("THE VIOLIN BOOK", BALAN BOOK, IMPRINT OF OUTLINE PRESS, LTD. 1999)

FLUTE

PIANO

LIBRARY

DEVICE: BASS GUITAR LOW E STRING FREQUENCY: 82.4 hz

| | | | | | | | | | | | |
|---|---|---|---|---|---|---|---|---|---|---|---|
| RATIO PARAMETER ( E ) | 1 | 1.8 | 1.03 | .81 | . | . | . | . | . | . | . |
| DECAY PARAMETER ( E ) | .98 | .96 | .93 | .6 | .45 | . | . | . | . | . | . |
| ATTACK DECAY RATE ( E ) | . | . | . | . | . | . | . | . | . | . | . |
| ATTACK RISE RATE ( E ) | . | . | . | . | . | . | . | . | . | . | . |

THE BEGINNING OF A NOTE SEQUENCE

METHOD OF SIGNAL SHREDDING

CROSS REFERENCE

The present invention is a continuation-in-part of U.S. application Ser. No. 09/430,293 filed Oct. 29, 1999 which claims the benefit of Provisional Patent Application Serial No. 60/106,150 filed Oct. 29, 1998.

FIELD OF THE INVENTIONS

The present inventions relate to signal and waveform processing and analysis. It further relates to the identification and separation of more simple signals contained in a complex signal and the modification of the identified signals.

BACKGROUND OF THE INVENTION

Audio signals, especially those relating to musical instruments or human voices, have a characteristic harmonic content that defines how the signal sounds. It is customary to refer to the harmonic as harmonic partials. The signal consists of a fundamental frequency (first harmonic $f_1$), which is typically the lowest frequency (or partial) contained in a periodic signal, and higher-ranking frequencies (partials) that are mathematically related to the fundamental frequency, known as harmonics. Thus, when the partial has a mathematical relationship to the fundamental, they are just referred to as harmonics. The harmonics are typically integer multiples of the fundamental frequency, but may have other relationships dependant upon the source.

The modern equal-tempered scale (or Western musical scale) is a method by which a musical scale is adjusted to consist of 12 equally spaced semitone intervals per octave. This scale is the culmination of research and development of musical scales and musical instruments going back to the ancient Greeks and even earlier. The frequency of any given half-step is the frequency of its predecessor multiplied by the 12th root of 2=1.0594631. This generates a scale where the frequencies of all octave intervals are in the ratio 1:2. These octaves are the only consonant intervals; all other intervals are dissonant.

The scale's inherent compromises allow a piano, for example, to play in all keys. To the human ear, however, instruments such as the piano accurately tuned to the tempered scale sound quite flat in the upper register, so the tuning of some instruments is "stretched," meaning the tuning contains deviations from pitches mandated by simple mathematical formulas. These deviations may be either slightly sharp or slightly flat to the notes mandated by simple mathematical formulas. In stretched tunings, mathematical relationships between notes and harmonics still exist, but they are more complex. Listening tests show that stretched tuning and stretched harmonic rankings are unequivocally preferred over unstretched. The relationships between and among the harmonic frequencies generated by many classes of oscillating/vibrating devices, including musical instruments, can be modeled by a function $$f_n=f_1\times G(n)$$

where $f_n$ is the frequency of the $n^{th}$ harmonic, $f_1$ is the fundamental frequency, known as the 1st harmonic, and n is a positive integer which represents the harmonic ranking number. Examples of such functions are $$f_n=f_1\times n \qquad \text{a)}$$

$$f_n=f_1\times n\times(S)^{\log_2 n} \qquad \text{b)}$$

$$f_n=f_1\times n\times[1+(n^2-1)\beta]^{1/2} \qquad \text{c)}$$

where S and β are constants which depend on the instrument or on the string of multiple-stringed devices, and sometimes on the frequency register of the note being played. The $n\times f_1\times(S)^{\log_2 n}$ is a good model of harmonic frequencies because it can be set to approximate natural sharping in broad resonance bands, and, more importantly, it is the one model which simulates consonant harmonics, e.g., harmonic 1 with harmonic 2, 2 with 4, 3 with 4, 4 with 5, 4 with 8, 6 with 8, 8 with 10, 9 with 12, etc. When used to generate harmonics, those harmonics will reinforce and ring even more than natural harmonics do.

Each harmonic has an amplitude and phase relationship to the fundamental frequency that identifies and characterizes the perceived sound. When multiple signals are mixed together and recorded, the characteristics of each signal are predominantly retained (superimposed), giving the appearance of a choppy and erratic waveform. This is exactly what occurs when a song is created in its final form, such as that on a compact disk, cassette tape, or phonograph recording. The harmonic characteristics can be used to extract the signals from the mixed, and hence more complex, audio signal. This may be required in situations where only a final mixture of a recording exists, or, for example, a live recording may have been made where all instruments are being played at the same time.

Musical pitch corresponds to the perceived frequency that the human recognizes and is measured in cycles per second. It is almost always the fundamental or lowest frequency in a periodic signal. A musical note produced by an instrument has a mixture of harmonics at various amplitudes and phase relationships to one another. The harmonics of the signal give the strongest indication of what the signal sounds like to a human, or its timbre. Timbre is defined as "The quality of sound that distinguishes one voice or musical instrument from another". The American National Standards Institute defines timbre as "that attribute of auditory sensation in terms of which a listener can judge two sounds similarly presented and having the same loudness and pitch are dissimilar."

Instruments and voices also have characteristic resonance bands, which shape the frequency response of the instrument. The resonance bands are fixed in frequency and can be thought of as a further modification of the harmonic content. Thus, they do have an impact on the harmonic content of the instrument, and consequently aid in establishing the characteristic sound of the instrument. The resonance bands can also aid in identifying the instrument. An example diagram is shown in FIG. 1 for a violin. Note the peaks show the mechanical resonances of the instrument. The key difference is that the harmonics are always relative to the fundamental frequency (i.e. moving linearly in frequency in response to the played fundamental), whereas the resonance bands are fixed in frequency. Other factors, such as harmonic content during the attack portion of a note and harmonic content during the decay portion of the note, give important perceptual keys to the human ear. During the sustaining portion of sounds, harmonic content plays a large impact on the perceived subjective quality.

Each harmonic in a note, including the fundamental, also has an attack and decay characteristic that defines the note's timbre in time. Since the relative levels of the harmonics may change during the note, the timbre may also change during the note. In instruments that are plucked or struck (such as pianos and guitars), higher order harmonics decay at a faster rate than the lower order harmonics. The string relies entirely on this initial energy input to sustain the note.

For example, a guitar player picks or plucks a guitar string, which produces the sound by the emission of energy from the string at a frequency related to the length and tension of the string. In the case of the guitar, the energy of the harmonics has its largest amount of energy at the initial portion of the note and then decay. Instruments that are continually exercised, including wind and bowed instruments (such as flute or violin), harmonics are continually generated. This is because the source is continually creating a movement of the string or breath of a wind player. For example, a flute player must continue to blow across the mouthpiece in order to produce a sound. Thus, each oscillation cycle puts additional energy into the mouthpiece, which continually forces the oscillatory resonance to sound and subsequently continues to produce the note. The higher order harmonics are thus present throughout most or all of the sustain portion of the note. An example of a flute and piano are shown in FIGS. 2A and 2B respectfully.

As an example, an acoustic guitar consists of 6 strings attached at one end to a resonating cavity (called the body) via an apparatus called a bridge. The bridge serves the purpose of firmly holding the strings to the body at a distance that allows the strings to be plucked and played. The body and bridge of the guitar provides the primary resonance characteristics of the guitar, and converts the oscillatory energy in the strings into audible energy to be heard. When a string is plucked or picked on the guitar, the string oscillates at the fundamental frequency. However, there are also harmonics that are generated. These harmonics are the core consistency of the generated timbre of the note. A variety of factors subsequently help shape to timbre of the note that is actually heard. The two largest impacts come from the core harmonics created by the strings and the body resonance characteristics. The strings generate the fundamental frequency and the core set of harmonics associated with the fundamental. The body primarily shapes the timbre further by its resonance characteristics, which are non-linear and frequency dependent. Many other components on the guitar also contribute to the overall tonal qualities of the guitar.

Resonant frequency responses of instruments also vary slightly depending on the portion of the note being played. The attack portion of a note, the sustain portion of a note, and the decay portion of a note may all exhibit slightly different resonance characteristics. There may also vary greatly between difference instruments.

Musical instruments typically have a range of notes that they can produce. The notes correspond to a range of fundamental frequencies that can be produced. These characteristic ranges of playable notes by the instrument of interest can also aid in identifying the instrument in a mixture of signals, such as in a recorded song. In addition to instruments that play specific notes are instruments that create less note-related signals. For example, a snare drum produces a broad array of harmonics that have little correlation to one another. These may be referred to herein as chaos harmonics. There is still a typical range of frequencies contained in the signal.

In addition to the range of fundamental frequencies an instrument creates, the overall frequency range of frequencies produced or generated by an instrument give characteristic clues as to the instrument creating the signal.

Instruments are often played in certain ways that give further clues as to what type of instrument is creating the notes or frequencies. Drums are played in rhythmic patterns, bass guitar notes also may be fairly regular and rhythmic in time. However, a bass guitar fundamental frequency overlaps few percussive instruments.

DESCRIPTION OF RELATED ART

Research into analysis and processing of superimposed signals has been occurring for decades. The more common usage has been directed towards voice signal identification or removal, and noise reduction or elimination. Noise reduction and elimination has often revolved around statistical properties of noise, but still often utilizes first-step analysis techniques similar to that of voice processing. Voice processing has diverged into several pathways, including voice recognition systems. Voice recognition systems utilize analysis techniques that differ from the focus of the present patent, although the method of the present invention can be used for voice recognition. Voice enhancement, on the other hand, can be approached using two approaches. The first focuses on the characteristics of signals other than the one of interest. The second focuses on the characteristics of the signal itself. In either case, the information gathered is used for subsequent processing to either enhance or remove unwanted information.

One should keep in mind that the present invention includes multiple, in some cases alternative, steps in analysis of one to many signals included in the superimposed signal. It is also a goal of the present invention to retain the original information contained within the superimposed signals.

Maher, in "An Approach for the Separation of Voice in Composite Signals", Ph. D. Thesis, 1989, Univ. of Illinois, approached the problem of automatically separating two musical signals recorded on the same recording track. Maher's approach relies on a Short Time Fourier Transform (STFT) process developed by McAuley and Quatieri in 1986. Maher focuses on two signals with little or no overlap in fundamental frequencies. Where there is harmonic frequency collision or overlap, Maher describes three methods of separation: a) linear equations, b) analysis of beating components, and c) signal models, interpolation or templates. Maher outlines some related information in his thesis. Maher has noted that limitations in his approach exist as information overlaps in frequency or other "noise", whether desired or not, inhibits the algorithm employed.

Danisewicz and Quatieri, "An Approach to co-channel talker interference suppression using a sinusoidal model for speech", 1998, MIT Lincoln Laboratory Technical Report 794, approached speech separation using a representation of time-varying sinusoids and least-squared error estimation when two talkers were at nearly the same volume level.

Kyma-5 is a combination of hardware and software developed by Symbolic Sound. Kyma-5 is the latest software that is accelerated by the Capybara hardware platform. Kyma-5 is primarily a synthesis tool, but the inputs can be from an existing recorded sound files. It has real-time processing capabilities, but predominantly is a static-file processing tool. Kyma-5 is able to re-synthesize a sound or passage from a static file by analyzing its harmonics and applying a variety of synthesis algorithms, including additive synthesis in a purely linear, integer manner.

A further aspect of Kyma-5 is the ability to graphically select partials from a spectral display of the sound passage and apply processing. Kyma-5 approaches selection of the partials visually and identifies "connected" dots of the spectral display within frequency bands, not by harmonic ranking number. Harmonics can be selected if they fall within a manually set band.

Another method is implemented in a product called Ionizer, which is sold/produced by Arboretum Systems. One method starts by using a "pre-analysis" to obtain a spectrum of the noise contained in the signal—which is only characteristic of the noise. This is actually quite useful in audio systems, since tape hiss, recording player noise, hum, and buzz are recurrent types of noise. By taking a sound print, this can be used as a reference to create "anti-noise" and subtract that (not necessarily directly) from the source signal. The part of this type of product that begins to seem similar is the usage of gated equalization in the passage within the Sound Design portion of the program. They implement a 512-band gated EQ, which can create very steep "brick wall" filters to pull out individual harmonics or remove certain sonic elements. They implement a threshold feature that allows the creation of dynamic filters. But, yet again, the methods employed do not follow or track the fundamental frequency, and harmonic removal again must fall in a frequency band, which then does not track the entire passage for an instrument.

SUMMARY OF THE INVENTIONS

The present invention provides methods for calculating and determining the characteristic harmonic partial content of an instrument or audio or other signal from a single source when mixed in with a more complex signal. The present invention also provides a method for the removal or separation of such signal from the more complex waveform. Successive, iterative and/or recursive applications of the present invention allow for the complete or partial extraction of signal source signals contained within a complex/mixed signal, heretofore referred to as shredding.

The shredding process starts with the identification of unambiguous note sequences, sometimes of short duration, and the transfer of the energy packets which make up those segments from the original complex signal file to a unique individual note segment file. Each time a note segment is placed into the individual note segment file, it is removed from the master note segment file. This facilitates the identification and transfer of additional note segments.

The difficulty in attempting to remove one instrument's or sources waveform from a co-existing signal (superimposed signal) lies in the fact that the energies of the partials or harmonics may have the same (or very close) frequency to that of another instrument. This is often referred to as a "collision of partials". Thus, the amount of energy contributed by one instrument or source must be known such that the remaining energy may be left intact, i.e. the energy for that frequency contributed by one or more other instruments or sources. Thus, the focus of the present invention addresses methods by which the appropriate amount of energy can be attributed to the current instrument or source of interest.

The present invention is carried out using several steps, each of which can aid in the discernment and identification of an individual instrument or source. The methods are primarily carried out on digital recorded material in static form, which may be contained in Random Access Memory (RAM), non-volatile forms of memory, or on computer hard disk or other recorded media. It is envisioned that the methods may be employed in quasi real-time environments, dependent upon which method of the present invention is utilized. Quasi-real time refers to a minuscule delay of up to approximately 60 milliseconds (it is often described as about the duration of two frames in a motion-picture film).

In one step, a library of sounds is utilized to aid in the matching and identification of the sound source when possible. This library contains typical spectra for a sound for various note frequency ranges (i.e. low notes, middle notes, and high notes for that instrument or sound). Furthermore, each frequency range will also have a characteristic example for low, middle, and high range volumes. Interpolation functions for volume and frequency are used to cover the intermediate regions. The library further contains stretch constant information that provides the harmonic stretch factor for that instrument. The library also contains overall energy rise and energy decay rates, as well as long term decay rates for each harmonic for when the fundamental frequency of a note is known.

In another step, an energy file is utilized that allows the tracking of energy levels at specified time intervals for desired frequency widths for the purpose of analyzing the complex signal. Increases in energy are used to identify the beginning of notes. By analyzing the energies in the time period just preceding the beginning of the attack period, the notes that are still sounding (being sustained) can be isolated. The rate of decay for the harmonics may also be utilized to identify the note and instrument.

After an entire passage has been stepped through in time and all time periods have been marked, significant repeating rhythm patterns are identified which aid in the determination of instruments or signal source. The identified energy packets are subsequently removed from the master energy file and placed in an individual note energy file. The removal from the master energy file aids in the subsequent determination and identification of notes and instruments.

There are circumstances where an adequate library does not exist for a given sound source, due to the fact that either the sounds source is quite unique or insufficient information (i.e. library information) has not been collected. In this case, an iterative process is used to develop a fingerprint of the instruments in a recorded passage. The fingerprint is defined by three or more basic characteristics which include 1) the fundamental frequency, 2) the energy ratios of the harmonics with respect to the fundamental and/or other harmonics, and 3) the energy decay rate for each harmonic. The fingerprint can then be used as a template for isolating note sequences and identifying other notes produced by the same instrument. The process starts by using the lowest frequency available in a passage to begin developing the fingerprint. The method progresses to the next higher frequency available that is consistent with the fingerprint, and so on. This is continued until all unambiguous note sequences are identified and removed. At this point, identifiable notes that match the fingerprint have been removed or isolated to a separate energy file. There are likely to be many voids of notes played by a single instrument throughout the passage. An interactive routine permits a user to listen to the incomplete part, which helps check that appropriate items were shredded out. The process can be repeated as desired with the reduced energy file. New unambiguous note sequences will then be revealed in order to fill in previously unidentified note sequences and complete the previously shredded parts. The entire sequence is then repeated until all subsequent instruments are identified and shredded out.

In additional steps, the libraries are still utilized. However notes, defined as a fundamental frequency and the accompanying harmonic spectra, that are shredded are divided up into three categories. The first category, math harmonics, are notes that are mathematically related in nature and the adjacent harmonics contained therein will be separated in frequency by an amount that equals the fundamental frequency. The second category, math harmonics plus chaos harmonics, are notes with added nonlinear harmonics in the attack and/or sustain portion of the notes. An example is a plucked guitar note where the plucked harmonics (produced from the noise of the guitar pick striking the string) have little to do with the fundamental frequency. Another example is a snare drum, where the produced harmonic spectra includes frequencies related to the drum head, but also containing chaos harmonics that are produced from the snares on the bottom side of the drum. The third category, chaos harmonics, are notes with harmonic content that has nothing to do with a fundamental frequency. An example is the guttural sounds of speech produced by humans.

Software divides the recorded signal into each note by determining which areas have frequencies that rise and fall in energy together. It is also preprocessed to extract any "easy to find" information. Next, the recording is recursively divided into the individual parts by utilizing further signatures related to harmonic content, resonance bands, frequency bands, overall frequency ranges, fundamental frequency ranges, and overall resonance band characteristics.

Other objects, advantages and novel features of the present invention will become apparent from the following detailed description of the invention when considered in conjunction with the accompanying drawings.

BRIEF DESCRIPTION OF THE DRAWINGS

FIG. 1 is a graph of frequency versus amplitude of a violin with the fundamental frequency of the G, D, A and E strings shown by vertical lines.

DETAILED DESCRIPTION OF THE PREFERRED EMBODIMENTS

Shredding—Method 1

[Step 1] Check off Instruments in Ensemble: The first steps require that a library of sound samples be collected for sound producing devices or instruments. Stringed instruments, for example, may be played in various ways (finger picking vs. flat-picking) which produced different characteristic sound fingerprints. Thus, this would require that each be treated as a difference "instrument" for the purpose of achieving the goal of shredding via method 1. Many instruments may be played in different fashions as well, such as trumpets with mutes, different strings on stringed instruments such as violin or guitar. For each instrument in the list, the lowest frequency it would produce normally in a professional performance will be listed. Likewise, template spectra (harmonic frequencies and energies) and interpolation functions will be provided.

Figure 2A:
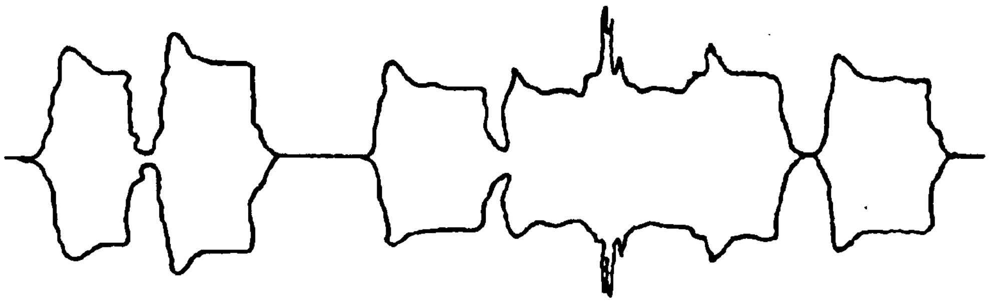
FIGS. 2A and 2B are graph representations of energy contained in a signal plotted versus time for a flute and a piano respectively.
Figure 2B:
Figure 3:
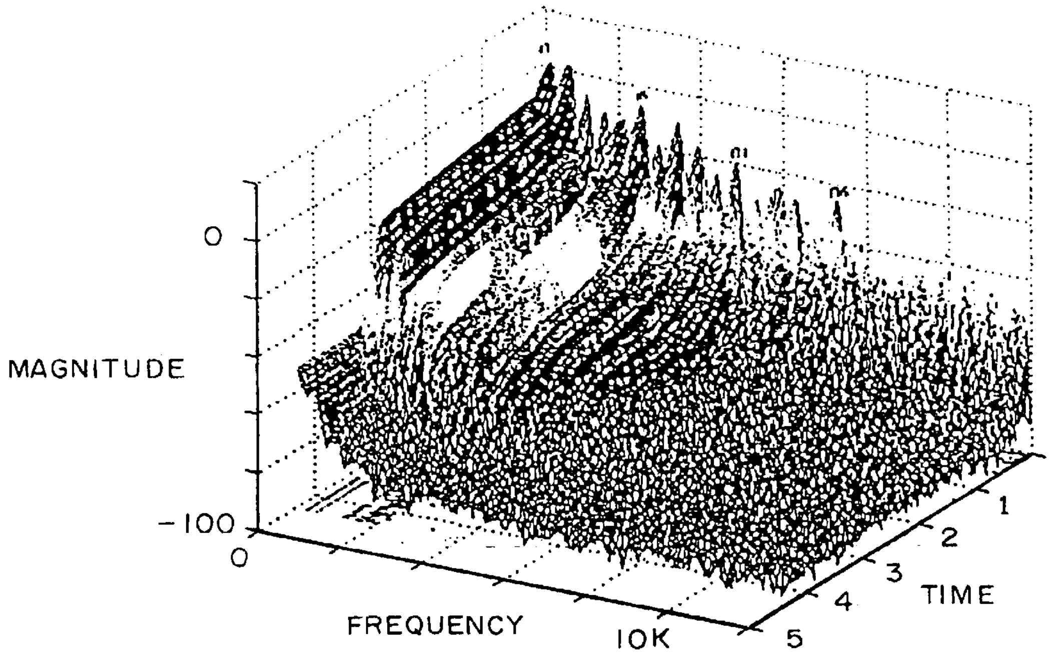
FIG. 3 is a complex waveform from a single strike of a 440 Hz. (i.e., $A_4$), piano key as a function of frequency (x axis), magnitude (y axis) and time (z axis).
Figures 4A, 4B:
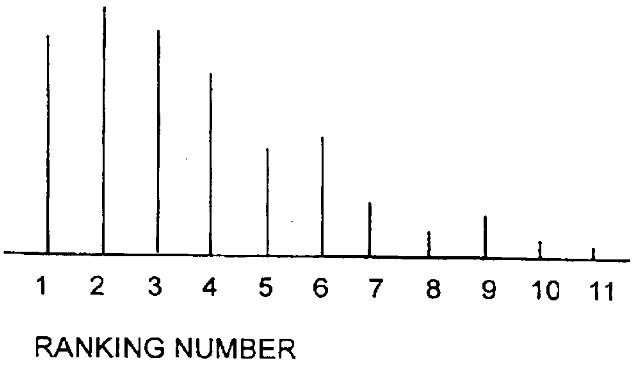
FIG. 4A is a library for a bass guitar low E string showing ratio parameter, decay parameter, attack decay rate, attack rise rate.
FIG. 4B shows the relative amplitude of the harmonics at one point in time.

[Step 2] For each instrument, call up the applicable template spectra and interpolation functions. Also call up the expected decay rates for various frequency bands for each of the instruments: Each library file contains a number of typical spectra for different playing volumes and different frequency ranges for each volume level. Areas in between either dimension (volume level or frequency range) may also be better matched by use of an interpolation function. The interpolation functions will allow the generation of spectra specific to any given fundamental frequency at any given energy level. By using an interpolation function, a smaller set of characteristic waveforms may be stored. Waveforms for comparison can be created from the smaller subset by deriving a new characteristic waveform from other existing library waveforms. The library may contain a set for different volume levels (e.g. low volume, medium volume, and high volume) and for different frequency ranges for that instruments normal frequency range (e.g. low frequency, middle frequency, and high frequency for that instrument). By interpolating between them, the characteristics for a comparison waveform may be derived rather than storing an accordingly huge number waveforms in the library. An example waveform for a single strike of a 440 Hz (i.e., $A_4$) piano key is shown in FIG. 3 and a portion of a library in FIG. 4A.

Furthermore, a stretch constant, S, can be calculated and utilized for each harmonic when the fundamental frequency is known. Furthermore, each library file contains functions by which attack and decay rates of the energies for each harmonic can be estimated when the frequency of the fundamental is known. The relationships between and among the harmonic frequencies generated by many classes of oscillating/vibrating devices, including musical instruments, can be modeled by a function $$f_n = f_1 \times G(n)$$

where $f_n$ is the frequency of the $n^{th}$ harmonic, $f_1$ is the fundamental frequency, known as the 1st harmonic, and n is a positive integer which represents the harmonic ranking number. Examples of such functions are $$f_n = f_1 \times n \qquad \text{a)}$$

$$f_n = f_1 \times n \times (S)^{\log_2 n} \qquad \text{b)}$$

$$f_n = f_1 \times n \times [1 + (n^2 - 1)\beta]^{1/2} \qquad \text{c)}$$

where S and β are constants which depend on the instrument or on the string of multiple-stringed devices, and sometimes on the frequency register of the note being played. The $n \times f_1 \times (S)^{\log_2 n}$ is a good model of harmonic frequencies because it can be set to approximate natural sharping in broad resonance bands, and, more importantly, it is the one model which simulates consonant harmonics, e.g., harmonic 1 with harmonic 2, 2 with 4, 3 with 4, 4 with 5, 4 with 8, 6 with 8, 8 with 10, 9 with 12, etc. When used to generate harmonics those harmonics will reinforce and ring even more than natural harmonics do.

Figure 5:
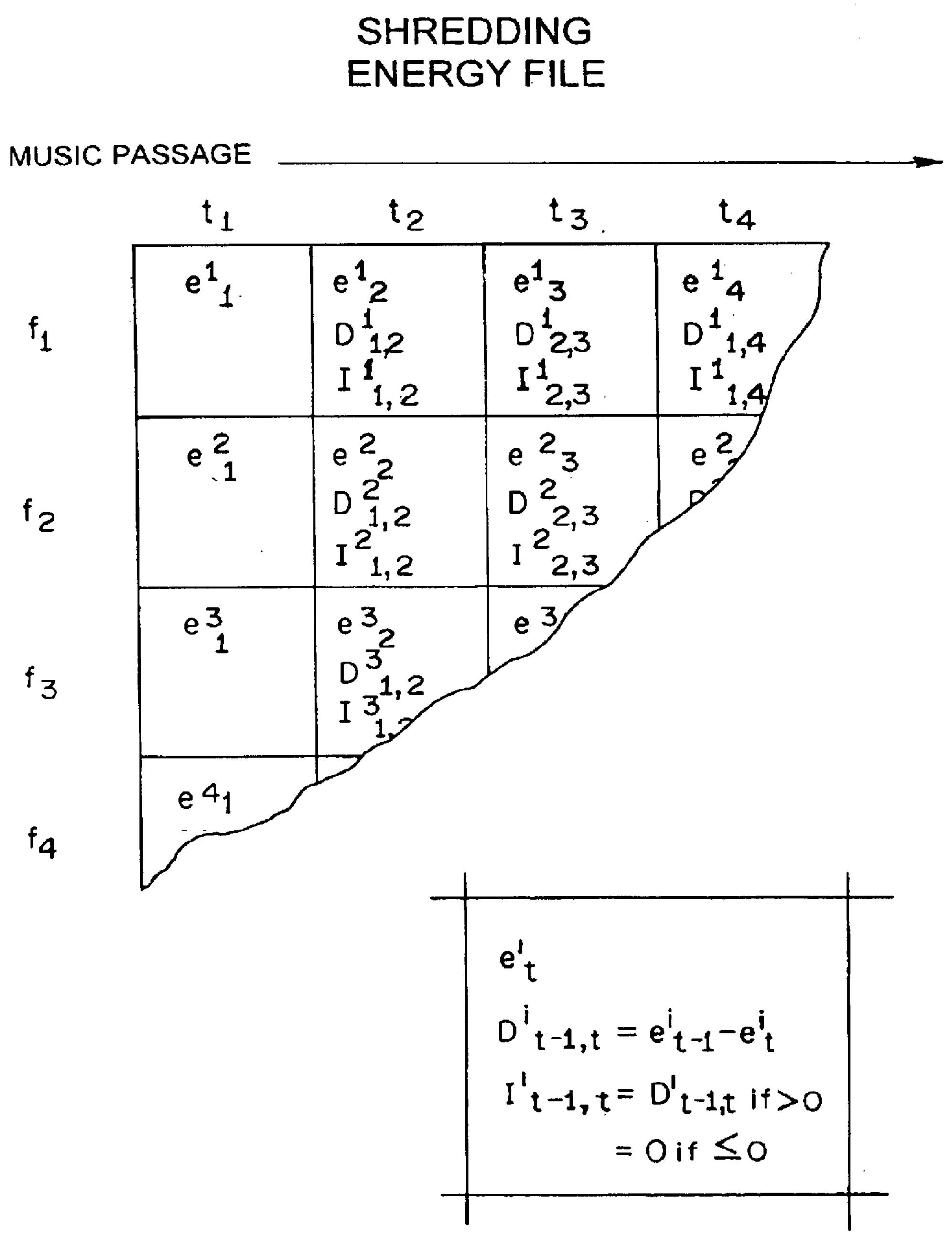
FIG. 5 illustrates one slice of an energy file in time and frequency according to the principles of the present invention.

[Step 3] Call up the passage of music to be shredded and generate a file showing energy levels for each frequency at each point in time ($e_{f,t}$) and rates of change (in time) of the energy at each frequency ($de_{f,t}/dt$): A sound passage is selected for analysis and processing. From this, an energy file is created as shown in FIG. 5. The energy file is three dimensional array representing the sound passage. The first axis is time. The passage is divided up into time slices representing a time period, for example, 5 milliseconds per slice. For each time slice, there is an array of frequency bins created, each of which represents some breakdown in frequency of the signal at that time slice, for example, p hundredths of a semitone. The range of the frequencies represented does not run from zero to infinity, but instead are some usable frequency range. The lower frequency limit may be, for example, 16 Hz, while the upper frequency may be 20 kHz. Within each frequency bin, the average energy during that time slice is stored. From here on, each time slice will be represented by the variable t, each frequency slice will be represented by the variable f, and each energy value will be represented by $e_{f,t}$.

After the energy file has been established, the differences in energies for each frequency is calculated with respect to the previous time period (except t=1)

$$D_{f,t}=e_{f,t}-e_{f,t-1}$$

In order to determine the beginning of notes or combinations of notes, this method measures only increases in energy values between two sequential time periods, $D_{f,t}$, which are greater than zero. Thus, for each time period, t, the sum of those positive differences within a specified broad frequency band is computed and designated $I_t$. The broad frequency band may be, for example, 20 Hz.

The beginning of notes can be detected by sudden increases in energy in a set of frequency bands, i.e. $I_t$ will exceed a specified threshold. The time period when this occurs is marked as the beginning of a note(s) and temporarily designated as T, which is the beginning of the attack phase of the starting notes(s) currently being considered. If two or more sequential time periods $I_t$ are greater than the threshold, the first of the time periods is designated T.

[Step 4] Find the lowest frequency in a passage and designate it as LL: The entire passage of interest is scanned for repeated energies in frequency bands. The range of each band is approximately f±¼ of a semitone. f actually varies continuously as the frequency is scanned, and it carries its band with it, starting from a little lower than the lowest fundamental frequency which can be produced by the ensemble in the recording. Thus, one can find the lowest sustained or repeated note.

[Step 5] Find and designate each uninterrupted sequence of LL energies as an LL note sequence: For each repetition of the lowest frequency, follow the frequency LL from the beginning to the end of an uninterrupted sequence. For wavering frequencies, the file will indicate the average frequency of a band of energies which is vibrating back and forth in frequency (vibrato), the average frequency of that wavering note plus the average amplitude of notes wavering in amplitude; and will have to tie together the energies generated by a note which is crescendoing or decrescendoing.

A "frequency shift" in a harmonic partial has been detected when a set of energies, cojoined by frequency at time T and centered at frequency f, overlap a set of energies cojoined in frequency at time T+1 and are centered around a somewhat different frequency; AND the total energy in the two cojoined overlapping sets is approximately the same. These conditions indicate one note changing in frequency.

Once the changing frequencies of energy bands have been isolated, the rest is easy. Frequency vibrato will be easy to detect and the vibrato rate in one of the harmonics of a note will show up precisely in the other harmonic of that note. Likewise, frequency sliding and bending will be easy to detect. Energy vibrato will also be easy to detect if you look at the sum of every set of energies cojoined by frequencies at a given time.

[Step 6] Determine and store start times, end times, starting energies added, exponential decay rate constants, and best guess as to actual frequency for all LL note sequences: The beginning of a frequency created by some instruments is accompanied by quick increases of energy followed by a sharp decline. For any given small frequency band, the end of the attack phase will be signaled by the stabilization of the energy levels at some time after T, as indicated by the values of $D_{f,t}$, remaining sufficiently close to 0 (zero) for a number of time periods. When this occurs over a specified broad frequency band (e.g., three specified octaves), the index number, t, of the first time period of the sequence of stabilized energy levels will be (T+a), where a is the number of time periods in the unstable attack period. Sustained frequencies are isolated by analyzing the energies in the pre-attack period, i.e. time period (T−1). This isolates the harmonics that were still sounding before the new harmonic began. The ratios of the energies of harmonics with respect to the fundamental frequency, the differences between harmonic frequencies, and other factors are exploited that aid in the note determination. The frequency is the "center of gravity" (i.e. weighted average) of the co-joined set of energies.

Comparisons of interpolated frequency spectra generated from the library with known energies, $e_{f,T-1}$, produced by the note at time (T−1) isolates all fundamental frequencies, the spectrum of each. This then determines which instrument was most likely to produce each note. The spectra and those sustained notes and the instrument types most likely to have produced each will be stored as notes sustained at (T−1).

Figure 6A:
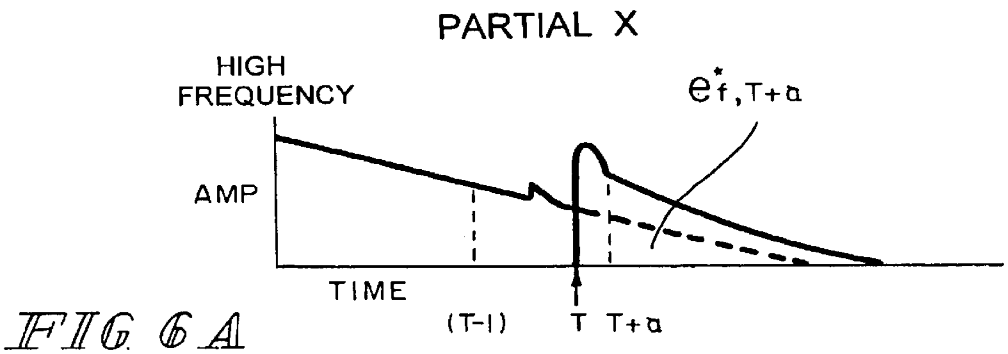
FIGS. 6A–6C illustrate the beginning of a plot of a note sequence for high frequency, middle frequency and low frequency rates respectfully in amplitude versus time.
Figure 6B:
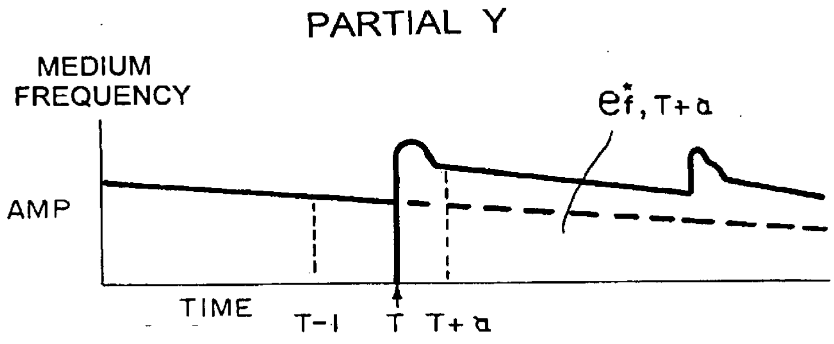
Figure 6C:
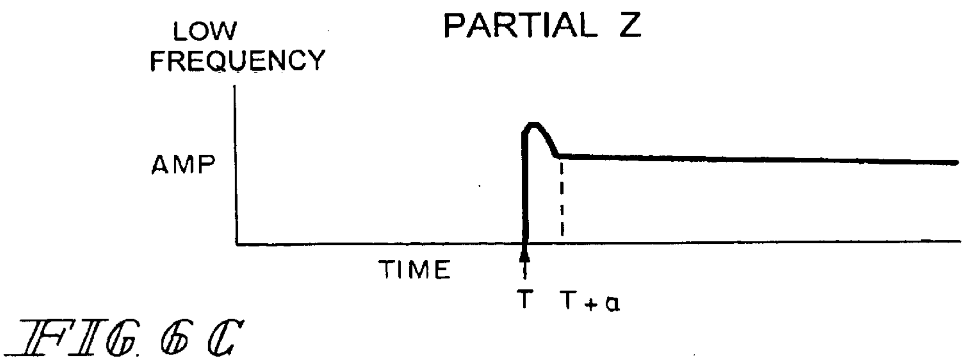

In order to isolate notes starting at time period T, the rate of decay of all energies $e_{f,T-1}$ are calculated by comparing those energies with corresponding energies in preceding time periods. To isolate the harmonics of the note starting at T, this method computes the energy increases stabilized as of (T+a). The method utilizes the rate of decay of energies being sustained at (T−1) to compute the estimated sustained energies at (T+a) designated as $e^*_{f,T+a}$. When the differences ($e_{f,T+a}$−($e_{f,T+a}$) are positive, they then represent increases in energy due to the newly added note and constitute the composite spectra of with new note. Using the same techniques as described above, the fundamental frequencies, the associated spectra of harmonics, and the likely devices that produced the note that just started are identified and recorded. FIGS. 6A–6C illustrate the beginning of a note sequence for high, medium and low frequency notes. The start time T, the stable time T+a and any prior note T−1 is shown.

[Step 7] Select the LL note sequence to shred first: Find the LL note sequence with LL ($f_1$) energy in the high middle range which starts from zero and is sustained the longest time. This is an indication of a time period that a single note is present. This will allow the removal of only that portion of energy related to that frequency and its harmonics when the note occurs with another note which has common harmonics (harmonic collision). This allows identifying of a portion of the energy related to the signal. Through repetition, the remaining portions of the signal can be identified and removed. Here, it is better to have a note sequence not formed by the rapid picking or striking of a note because we will get better information on decay rates. Also, more certainty exists as to the instrument that produced the note (e.g., a pizzicato violin dies out much more quickly than a guitar; also, a very high note played on a bass guitar E string probably dies much more quickly than the same note played on a guitar D string).

[Step 8] Compute the decay rates for the harmonics of LL given the measured energy. Compare those to the decay rates read in at step 2:

[Step 9] Discard from consideration instruments that have decay rates that are inconsistent with the measured decay rates. Also discard instruments which could not have produced the LL at hand and discard instruments which cannot fit into the remaining time space.

[Step 10] For the instrument which is for the time being presumed to have sounded the selected LL note sequence, generate the special frequency-energy spectrum for the fine-tuned frequency of the LL note sequence at hand and for the beginning energy of that note sequence ($f_1$ or possibly $f_1+f_2+f_3$). Use the template spectra that have frequencies and energies, which span the actual frequency, and energy. Then use the interpolation function.

[Step 11] Select the instrument that generated the LL note sequence at hand.

Instrument by instrument, compare the template spectra to the energies added to the LL harmonic frequency bands. matching template spectrum energy ratios to the energies of the ratios added, realizing that the harmonics of other notes could have contributed some of the increases and realizing that energy-rises starting from zero are reliable indicators, generate a match-fit value for each instrument.

It may be possible also to generate a match-fit value considering the time space files generated below.

Note that if the energy rise within any given harmonic frequency band is less than the energy rise indicated by the matching template spectrum, then there's no way to explain the missing energy except by assuming an anomaly or a measuring error. Also note that if the energy rise is much greater than one would expect, and if the rise in energy is consistent with only one instrument sounding the LL note, then again one must assume an anomaly or a measuring error or the possibility that two notes sounded exactly at the same time.

Without the library, the frequencies of the harmonics of the note are not known nor their expected energy nor the decay rates of the harmonics and no good way to tell which instrument sounded the note. Any number of instruments could have sounded the note and the information of energies at different frequencies does not identify the harmonic frequencies of the note, nor what the energies at the different harmonic frequencies should be. In particular, the high harmonics produced by some instruments aren't even close to $n \times f_1$. They can be off by a semitone or more, e.g., for some guitar strings the $17^{th}$ harmonic is off a full semitone from $n \times f_1$ and the harmonics higher than $17^{th}$ are off more than that. For other instruments, the $17^{th}$ are harmonic is only slightly sharper than $n \times f_1$. Thus, the high harmonics are not known frequency-wise, without assuming an instrument.

Reviewing the instrument, the instrument that produced the note at hand is known, and which frequency bands correspond to each of the harmonics of the note can determine with the energy in each of those frequency bands. If the energy is greater than the energy which is expected, go back and find what sources (fundamental frequencies) could have been sources of additions to the frequency band (harmonic) in question. Again, we not only have to be instrument-specific in looking for the sources, but we must have a function which tells us how the frequencies of the various harmonics relate to the fundamental. By going around and around this way we can find for each harmonic frequency of the note on hand, the sources (instrument and fundamental frequency) that produced energies which were added to the harmonic in question can be found.

[Step 12] Knowing the instrument which produced the note, allocate the energy in a specific harmonic frequency band to the various sources which could have contributed harmonic energy to that band:

Instrument by instrument, look at the energy in the possible sources. For illustrative purposes, assume that the source instrument being considered has harmonics related by the function ($\log_{2.004} n$). Also assume that the energy in the harmonic we are considering is energy at frequency 200 hz. Thus one possible source of energy which would contribute to the makeup of the energy at 200 would be the energy at frequency $200 \div 2.004$. Another source could be energy at frequency $(\log_2 3)^{2.004}$. Consider for the time being the energy at $200 \div 2.004$. Suppose that energy is equal to 10. By checking the template spectra and interpolating, the energy that would be provided to frequency 200 by a note pitched at $200 \div 2.004$ can be estimated.

Now determine whether or not the instrument produced the energy at the assumed frequency band. Therefore we go to the subroutine which determines the instrument that produced that energy. It is essentially the subroutine described above. If it, is the right instrument, make a tentative allocation. If not the right instrument, start all over.

Figure 7A:
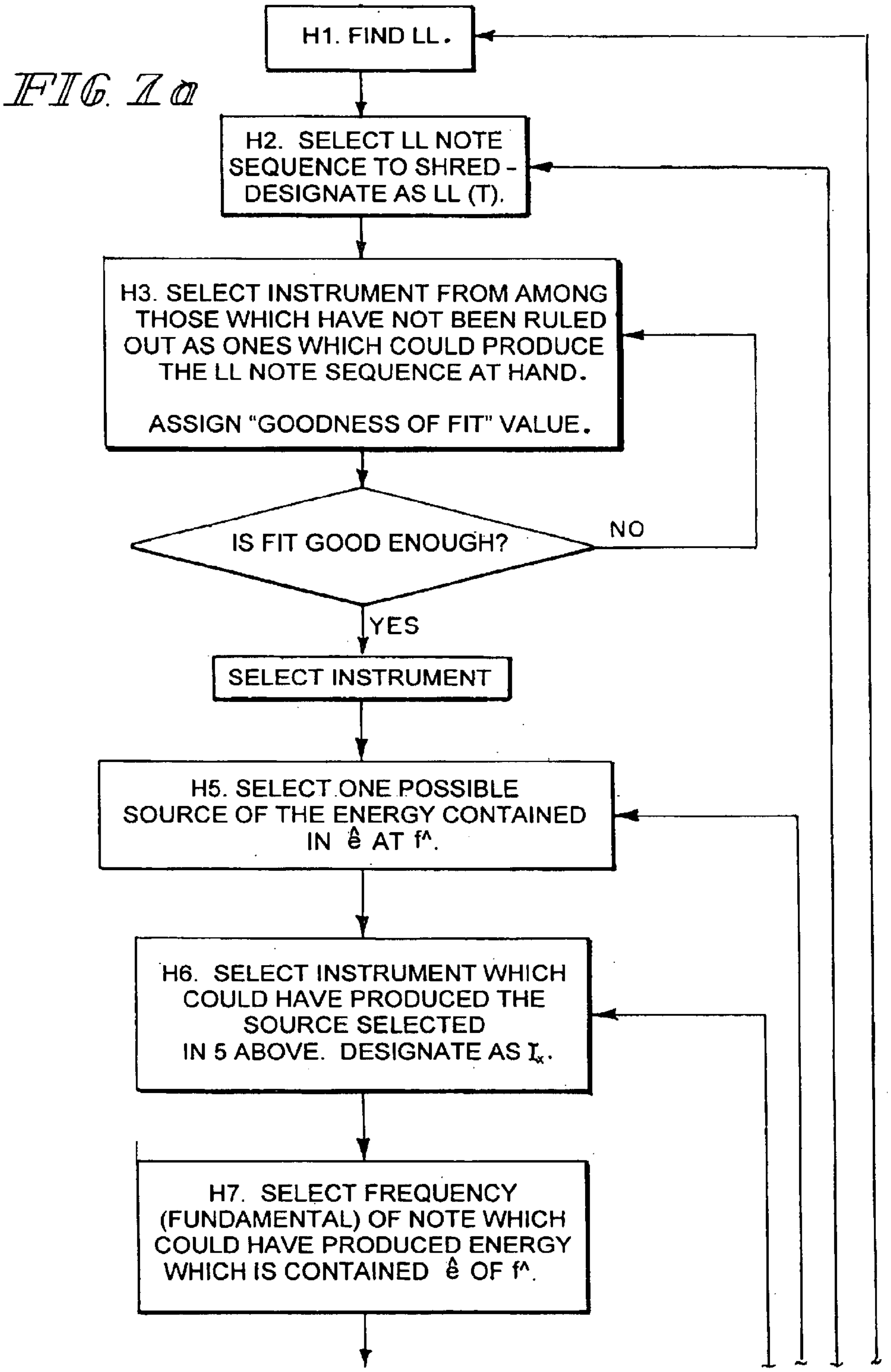
FIG. 7 is a flow chart of a method of shredding incorporating the principles of the present invention.
Figure 7B:
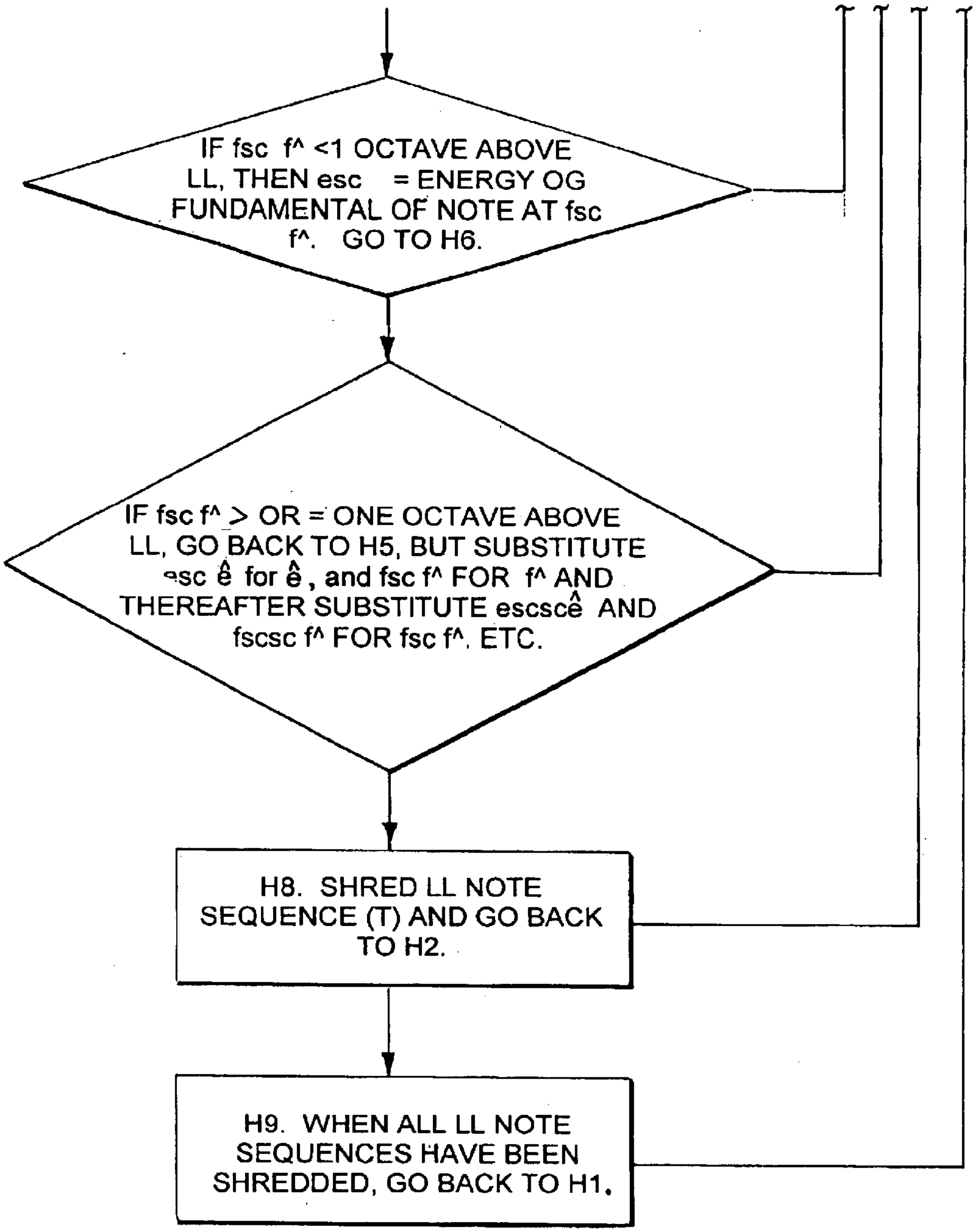

An example of a flow chart is shown in FIG. 7.

After an entire passage has been stepped through in time and all time periods which mark the beginning of notes have been flagged, the passage is analyzed for repeating rhythm patterns. This is done by building a rhythm slide rule.

Additional steps may be employed in the shredding process that aid in the identification of instruments. The steps rely on instrument identification techniques that can be used to guide previous steps, or help identify instruments within a particular passage by recognizing certain characteristics of a played note. Some characteristics include note onset, note sustain, and note decay. The particular implementation disclosed herein will be done so in the context of software, resident on a computer system. It is envisioned that the methods may be employed in pseudo real-time environments, dependent upon which method of the present invention is utilized. Nevertheless, it should be appreciated that the same process may be carried out in a purely hardware implementation, as in a hybrid implementation that includes, but is not limited to application specific integrated circuits (ASICS) and/or field programmable grid array (FPGAs).

The notes to be shredded according to this embodiment are classified in three categories: (1) mathematical harmonics; (2) mathematical plus chaos harmonics; and (3) chaos harmonics, For these purposes, "mathematical harmonics" may be defined as notes that are mathematically related in nature. "Mathematical harmonics plus chaos harmonics" may be defined as notes with added non-linear additional harmonics to the attack and/or sustain phase of the notes. A plucked guitar note, for example, where the plucked harmonics have very little to do with the note's fundamental frequency, and a snare drum having mathematical harmonics from the drum and chaos harmonics from the snares would both fall into this category. Finally, "chaos harmonics" may be defined as those harmonics having virtually nothing to do with the fundamental frequency (e.g., fricatives and other guttural sounds of speech or crashed cymbals, etc.). It should be understood that not all harmonic spectra are pure, mathematical harmonics. Similarly, it should also be appreciated that certain chaos harmonics may have some regularity that would help find a "signature" for shredding.

In the manner previously described, the music or other similar such waveform is divided into separate notes by analyzing the amplitude of those parts of the music that rise and fall together as a guide. The energy file is first pre-processed to extract certain information that is relatively easy to find. Thereafter, the waveform is recursively divided into its component using one or more of the following parameters to detect further similarities/signatures. The following steps are envisioned to follow the first steps outlined previously, but are not limited to this order, it may not be necessary to carry out the previous steps or part of the processing the user wishes to perform. Thus, the following method may be separated from Method 1 or a part thereof.

Method 2

One parameter that may be analyzed is the amplitude of each note as it relates to the amplitudes of any other notes. As used herein, the term "note" is defined as any particular frequency and its associated harmonics, including integer and non-integer harmonics (i.e., partials). This may be accomplished, for example, by analysis of the amplitudes of sine waves in relation to each other. Sine waves that have amplitudes correlating to each other, whether in the form of absolute amplitude level, movement in amplitude to each other, etc., are particularly appropriate. This step looks across the energy file and analyzes the energy increases systematically and matches relative energy rises. Since energy may exist in a sine wave already, absolute energy comparisons are not necessarily an absolute guide. Thus, an energy gradient measurement is used to look for similar rises in energy in time.

It is recognized that not all harmonics start at the exact moment. For this reason, a parameter (which can be user configured) is used to provide some time span in which the comparison takes place. As an energy rise is detected in one frequency, energy rises in other frequency bands are also measured to provide the basis for the "matching" of sine wave energy rises. It must be stated that in this case, sine wave energy rise may not necessarily be of harmonic relationship at this point, which frees the system to take a broader perspective of the current note (or other sound) being played. This method is particularly good for establishing note or sound beginning points. It also serves as a precursor to the next step.

An additional key piece of information in the linking of these sine waves is the overall frequency range of the instrument. Like the individual phases of a note, the overall resonance band characteristics and overall frequency ranges comprise additional parameters for analysis. Any given instrument creates a set of notes that fall within a particular range of frequencies. For example, a bass guitar plays only in low frequency ranges, which do not overlap with the frequency ranges of other instruments (e.g., a piccolo). Using this information, one may readily distinguish which instrument played a particular note. For example, a bass guitar range is about 30 Hz, while the lowest frequency range of a violin starts at around 196 Hz. This range of frequencies of notes aids in eliminating certain instruments from consideration.

The next step used in the analysis is rhythmic similarities, which may be determined using a "rhythmic slide rule". That is, certain passages of music and individual instruments have readily identifiable patterns of rhythm that can be monitored. With certain instruments, for example, notes are played at fairly regular intervals and repeating rhythm patterns. Further shredding of individual instruments and the notes they play may, thus, be realized through use of such information. As note or sound beginning points is established, time related "regularity" could be established. Such rhythms can be found in certain frequency bands, but are not necessarily limited to this case. However, if a certain frequency range sees an exceptionally regular interval established, these points are recorded and established as "rhythm matches", which, in turn, establishes them as key time indices for the processing or removal in relation to the areas that rise and fall in energy together. It is noted that rhythmic similarities are slightly variable over measures. Thus, an interactive feature is established such that marked areas can be auditioned such that the user can aid in identification of proper note or sound selection.

Yet another group of parameters may be selected by analysis of the various phases of a note. For example, in the "attack phase", one may analyze its harmonic partials content by comparison of the percentage of the note's fundamental frequency to its harmonic partials. It should be noted that the extension of this comparison does not necessarily assume that the harmonic partials are related in a mathematical way, as previous used in integer or integer-function relationships among harmonics to the fundamental. The attack phase of a note is the initial phase where the overall amplitude of the note is increasing, most often in a very dramatic way (but not necessarily). In such general terms, the attack phase is the initial portion of a played note up to and including the settling in of the note into its "sustain phase".

By monitoring the harmonic-partial content during a note's attack phase, one may further identify the note and the instrument playing that note, since the relative magnitude of its harmonics and their relative attack and sustain are likely to uniquely characterize an instrument further. The extension of this concept to non-integer functional relationships allows the comparison to exist over frequency bands of any width. These relationships may be either distinct, or may also be induced by resonance characteristics of the instrument. Monitoring the resonance bands and frequency bands of the attack phase may also aid in the identification of an instrument in a passage of music.

During the attack phase, certain frequency ranges usually contain the majority of a note's energy. This is, again, characteristic of particular instruments, related to an instrument's resonance. The attack frequency band of an instrument playing given notes is also usually constrained within an overall frequency range. Again, matching of frequency ranges for particular instruments can help separate a note or sound from another by a comparison of the frequency ranges. This is especially useful for notes or sounds from instruments that are in completely different register frequency ranges (e.g. bass and flute).

As in the case of the attack phase, the harmonic content, resonance bands, and frequency bands of the sustain-phase of a note may be analyzed in accordance with the present invention. A note's sustain phase immediately follows its attack phase and tends to be more constant in amplitude. The harmonic-partial content in this portion of a note also contains characteristics, which help identify the note and the instrument. By using the relative magnitude of harmonic-partials within the sustain phase, one may further identify the characteristic sounds of any given instrument. Monitoring the resonance bands (i.e. overall resonant peaks) in a note's sustain phase is also useful in characterizing an instrument.

During the sustain phase of a note, certain frequency ranges contain the majority of its energy. This is, again, characteristic of particular instruments. These characteristics are related to the resonance of the instrument and its components after a played note has settled into the sustain phase. Likewise, by use of the sustain-phase frequency bands (i.e., overall frequency bandwidth of the sustain-phase), one may identify a note or instrument during the sustain-phase, since the frequencies evidenced are generally contained within an overall frequency range.

Still another group of parameters useful in shredding a passage of music in accordance with the present invention occurs during the decay-phase of a note. Like in the attack and sustain phases, the harmonic content, resonance bands, and frequency bands of the decay phase may be used in the identification of any note or given instrument. The decay phase of a note follows its sustain phase. This phase is normally considered to terminate the note. Harmonic-partial content, or more specifically, how the harmonic content of the decay phase changes over time, is indicative of the instrument that played it.

Some instruments are known to produce notes which decay in rather unique ways (i.e., at least with respect to the harmonic content and relative magnitude of the notes played on the instrument). For example, plucked or struck instruments often have a natural exponential or logarithmic type decay that fades towards "zero energy". This can be modified by a user forcing a note to stop quicker, such as a guitar player muting a note with the palm of the hand. In contrast, wind instruments require the continuous creation of energy by the player, and notes typically stop very quickly once the wind player stops blowing into or across the mouthpiece of the instrument. Similar results are exhibited by stringed instrument players, but those decays are often characteristically unique from other instruments.

The harmonic content in this phase of a note contains characteristic patterns, which help identify the note and the instrument. Furthermore, the relative magnitude of harmonics during this phase gives an instrument its characteristic sound. For example, again, stringed or plucked instruments have higher-order harmonics that decay much faster than the lower harmonics, and therefor may not exist any longer at the end of the note. The resonance and frequency bands during the decay phase of a note, in a similar manner, are useful in identifying the instrument. This is because certain frequency ranges contain the majority of a note's energy during its decay phase, and this is characteristic of particular instruments. Moreover, the frequencies that occur with such instruments are generally contained within an overall frequency range.

For any given instrument, the physical characteristics of that instrument contain certain ranges of frequencies where they resonate more than in other areas. A good example is the human voice, which has four resonance bands. These resonance bands are determined by the various materials and cavities of the human body, such as the sinus cavities, the bones in the head and face, chest cavity, etc. In a similar manner, any instrument will have particular resonance characteristics, and any other similar instrument will have that same somewhat unique characteristic. Notes played within such resonance bands will tend to be accentuated in magnitude.

One important consideration is the use of silent periods in a passage. Silent period are exhibited in specific frequencies, frequency ranges, and entirely across the spectrum. These silences are both intentional and unavoidable. Some instruments can only play notes that are separated by (often minuscule) amounts of silence, but these clearly designate a new note. Some instruments are able to start new notes without a break in a note, but a change in the energy is required to notice a change in either upward or downward direction. Very brief and short silences in between notes often dictate a quickly repeating note played by the same instrument, and are used as identifiers in the same way energy rises can be utilized.

Constraint parameters must first be set and optimized. However, the optimization is often iterative and requires gradual refinement. A number of the parameters set forth above must be determined by polling the library or asking a user for a decision. The ability for such software to detect notes is obviously enhanced with user interaction. According to this aspect of the present invention, certain sounds (e.g., those sounds or notes that are difficult to determine using the match system set forth above and/or difficult to differentiate between other sounds/notes) may be annotated by use of a software flag or interrupt. A mouse or other input means operated by the user may also be used to mark the notes of an instrument in three or more areas. Those marked notes will then be sent to a library (e.g., a register, FIFO/LIFO buffer, or cache memory) for further post-processing analysis. Preferably, the user identifies and marks the lowest cleanest note, a middle cleanest note, and the highest cleanest note, thereby developing a library of the instruments from the song being shredded.

Once all of the notes have been identified and their associated instruments have been identified, the entire musical passage is linked together in a coherent fashion for further processing. Each of the starting and ending points of the notes are now known. At this juncture, it should be evident that such linking will inherently contain "empty space" (or "no note") information. The identified harmonics may then be accentuated in accordance with the harmonic accentuation aspect set forth herein below (e.g., to remove the snare drum completely, accentuate the snare drum, or de-emphasize the snare drum). It is irrelevant what the ultimate goal of the user is in shredding. What is relevant, however, is the new method and shredded computer file that can identify the snare drum and all its harmonics through the song separate and distinct from any other instrument. This can be done for all of the instruments in any given musical passage, until all that is left is noise.

Implementation

Figure 8:
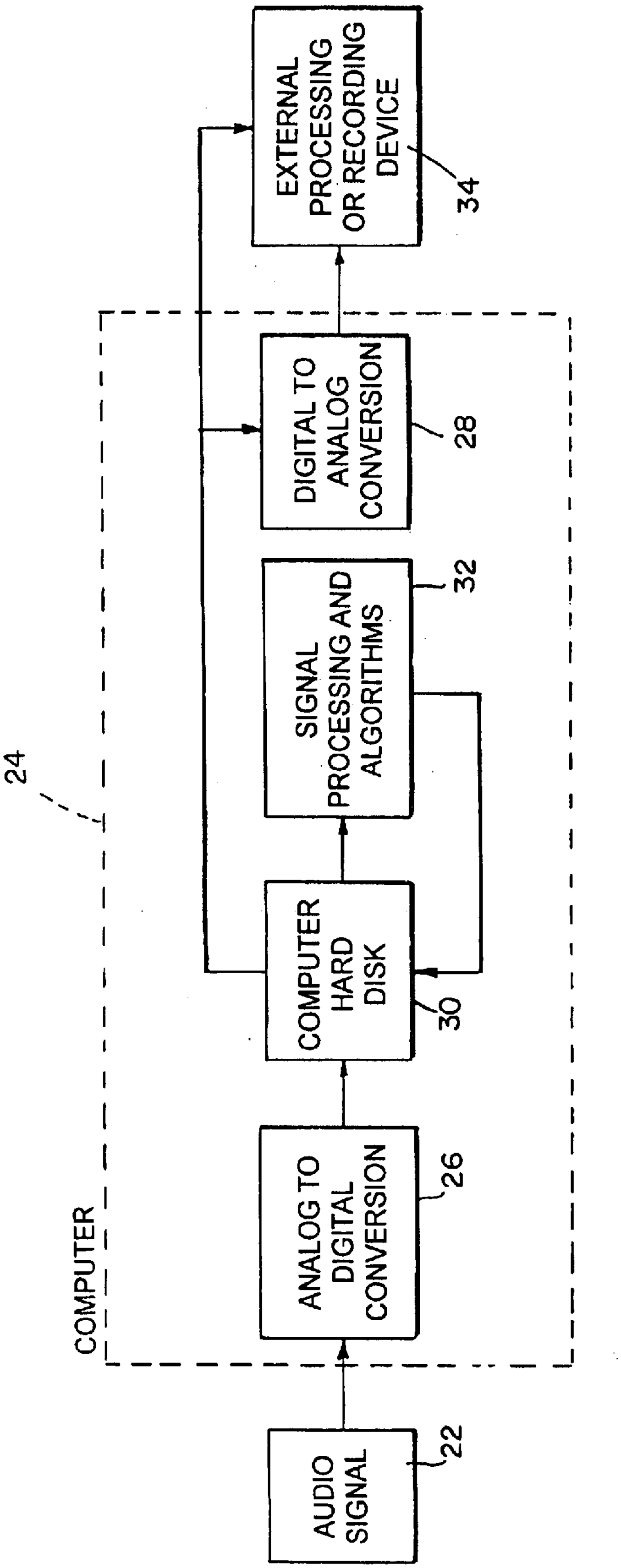
FIG. 8 is a block diagram of a system performing the operations of the present invention.

As shown in FIG. 8, one implementation variant includes a source of audio signals 22 connected to a host computer system, such as a desktop personal computer 24, which has several add-in cards installed into the system to perform additional functions. The source 22 may be live or from a stored file. These cards include Analog-to-Digital Conversion 26 and Digital-to-Analog Conversion 28 cards, as well as an additional Digital Signal Processing card that is used to carry out the mathematical and filtering operations at a high speed. The host computer system controls mostly the user-interface operations. However, the general personal computer processor may carry out all of the mathematical operations alone without a Digital Signal Processor card installed.

The incoming audio signal is applied to an Analog-to-Digital conversion unit 26 that converts the electrical sound signal into a digital representation. In typical applications, the Analog-to-Digital conversion would be performed using a 20 to 24-bit converter and would operate at 48 kHz –96 kHz [and possibly higher] sample rates. Personal computers typically have 16-bit converters supporting 8 kHz –44.1 kHz sample rates. These may suffice for some applications. However, large word sizes—e.g., 20 bits, 24 bits, 32 bits—provide better results. Higher sample rates also improve the quality of the converted signal. The digital representation is a long stream of numbers that are then stored to hard disk 30. The hard disk may be either a stand-alone disk drive, such as a high-performance removable disk type media, or it may be the same disk where other data and programs for the computer reside. For performance and flexibility, the disk is a removable type.

Once the digitized audio data is stored on the disk 30, a program is selected to perform the desired manipulations of the signal. The program may actually comprise a series of programs that accomplish the desired goal. This processing algorithm reads the computer data from the disk 32 in variable-sized units that are stored in Random Access Memory (RAM) controlled by the processing algorithm. Processed data is stored back to the computer disk 30 as processing is completed.

In the present invention, the process of reading from and writing to the disk may be iterative and/or recursive, such that reading and writing may be intermixed, and data sections may be read and written to many times. Real-time processing of audio signals often requires that disk accessing and storing of the digital audio signals be minimized, as it introduces delays into the system. By utilizing RAM only, or by utilizing cache memories, system performance can be increased to the point where some processing may be able to be performed in a real-time or quasi real-time manner. Real-time means that processing occurs at a rate such that the results are obtained with little or no noticeable latency by the user. Dependent upon the processing type and user preferences, the processed data may overwrite or be mixed with the original data. It also may or may not be written to a new file altogether.

Upon completion of processing, the data is read from the computer disk or memory 30 once again for listening or further external processing 34. The digitized data is read from the disk 30 and written to a Digital-to-Analog conversion unit 28, which converts the digitized data back to an analog signal for use outside the computer 34. Alternately, digitized data may written out to external devices directly in digital form through a variety of means (such as AES/EBU or SPDIF digital audio interface formats or alternate forms). External devices include recording systems, mastering devices, audio-processing units, broadcast units, computers, etc. Processing occurs at a rate such that the results are obtained with little or no noticeable latency by the user. Dependent upon the processing type and user preferences, the processed data may overwrite or be mixed with the original data. It also may or may not be written to a new file altogether.

Upon completion of processing, the data is read from the computer disk or memory 30 once again for listening or further external processing 34. The digitized data is read from the disk 30 and written to a Digital-to-Analog conversion unit 28, which converts the digitized data back to an analog signal for use outside the computer 34. Alternately, digitized data may written out to external devices directly in digital form through a variety of means (such as AES/EBU or SPDIF digital audio interface formats or alternate forms). External devices include recording systems, mastering devices, audio processing units, broadcast units, computers, etc.

Fast Find Harmonics

The implementations described herein may also utilize technology such as Fast-Find Fundamental Method to process in quasi real time. This Fast-Find Method technology uses algorithms to deduce the fundamental frequency of an audio signal from the harmonic relationship of higher harmonics in a very quick fashion such that subsequent algorithms that are required to perform in real-time may do so without a noticeable (or with an insignificant) latency. The Fast-Find algorithm may provide information as to the location of harmonic frequencies such that processing of harmonics may be carried out fast and efficiently.

The method includes selecting at least two candidate frequencies in the signal. Next, it is determined if the candidate frequencies are a group of legitimate harmonic frequencies having a harmonic relationship. Finally, the fundamental frequency is deduced from the legitimate frequencies.

In one method, relationships between and among detected partials are compared to comparable relationships that would prevail if all members were legitimate harmonic frequencies. The relationships compared include frequency ratios, differences in frequencies, ratios of those differences, and unique relationships which result from the fact that harmonic frequencies are modeled by a function of harmonic ranking number. Candidate frequencies are also screened using the lower and higher limits of the fundamental frequencies and/or higher harmonic frequencies which can be produced by the source of the signal.

The method uses relationships between and among higher harmonics, the conditions which limit choices, the relationships the higher harmonics have with the fundamental, and the range of possible fundamental frequencies. $f_n=f_1 \times n \times G(n)$ models the frequency of the nth harmonic. Examples are:

a) Ratios of candidate frequencies $f_H$, $f_M$, $f_L$, must be approximately equal to ratios obtained by substituting their ranking numbers $R_H$, $R_M$, $R_L$ in the model of harmonics, i.e., $f_H\ f_M >> \{R_H \times G\ (R_H)\}\ \{R_M \times G\ (R_M)\}$, and $f_M\ f_L >> \{R_M \times G\ (R_M)\ \{R_L \times G\ (R_L)\}$.

b) The ratios of differences between candidate frequencies must be consistent with ratios of differences of modeled frequencies, i.e., $(R_H - R_M)(R_M - R_L) >> [\{R_H \times G(R_H)\} - \{(R_M \times G(R_M)\}][\{_M \times G(R_M)\}\{(R_L \times G(R_L)\}]$.

c) The candidate frequency partials $f_H$, $f_M$, $f_L$ must be in the range of frequencies which can be produced by the source or the instrument.

d) The harmonic ranking numbers $R_H$, $R_M$, $R_L$ must not imply a fundamental frequency which is below, $F_L$ or above $F_H$, the range of fundamental frequencies which can be produced by the source or instrument.

e) When matching integer variable ratios to obtain possible trios of ranking numbers, the integer $R_M$ in the integer ratio $R_H/R_M$ must be the same as the integer $R_M$ in the integer ratio $R_M/R_L$, for example. This relationship is used to join Ranking Number pairs $\{R_H, R_M\}$ and $(R_M, R_L\}$ into possible trios $\{R_H, R_M, R_L\}$.

The candidate frequency and its ranking number can be used in the previously described methods even with out deducing the fundamental frequency to modify or synthesize harmonics of interest.

Another method for determining legitimate harmonic frequencies and deducing a fundamental frequency includes comparing the group of candidate frequencies to a fundamental frequency and its harmonics to find an acceptable match. This includes, creating a harmonic multiplier scale for the fundamental and all of its harmonics. A candidate partial frequency scale is created with the candidate frequencies and compared to the harmonic multiplier scale to find an acceptable match. The ranking number of the candidate frequencies is determined from the match of the two scales. These ranking numbers are then used to determine whether the group is a group of legitimate frequencies. If this is so, the match can also be used to determine the fundamental frequency or further calculation can be performed. Preferably, the scales are logarithmic scales.

The present invention does not rely solely on Fast-Find Fundamental to perform its operations. There are multitudes of methods that can be utilized to determine the location of fundamental and harmonic frequencies, such as Short-Time Fourier Transform methods, or the explicit locating of frequencies through filter banks or auto-correlation techniques. The degree of accuracy and speed needed in a particular operation is user-defined, which helps aid in selecting the appropriate frequency-finding algorithm.

Figure 9:
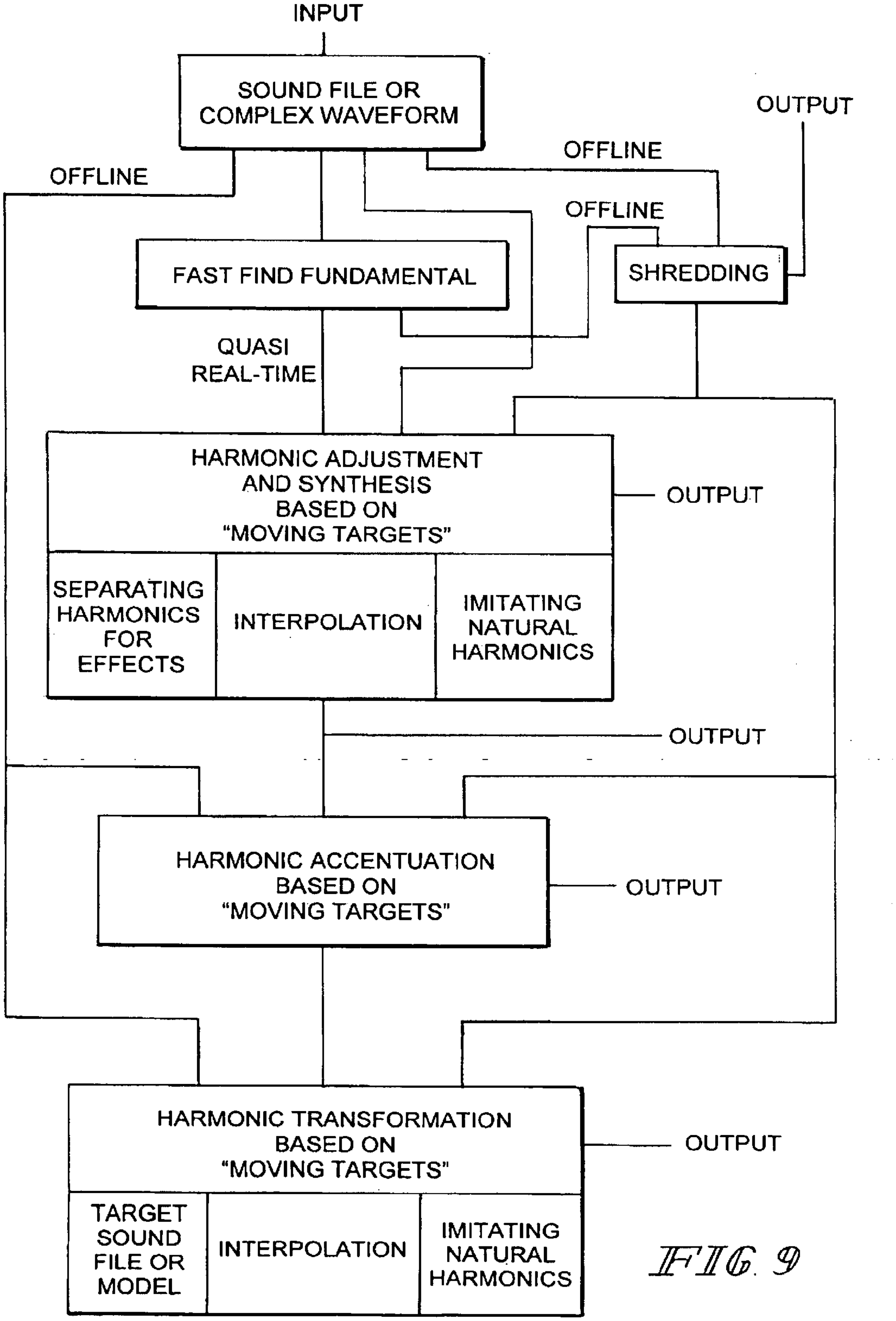
FIG. 9 is a block diagram of the software method steps incorporating the principles of the present invention.

The potential inter-relationship of the various systems and methods for modifying complex waveforms according to the principles of the present invention are illustrated in FIG. 9 and described in detail in U.S. patent application Ser. No. 09/430,293 filed Oct. 29, 1999 and incorporated herein by reference. Input signals provided to a sound file as complex waveforms. This information can then be provided to a Fast Find Fundamental method or circuitry. This may be used to quickly determine the fundamental frequency of a complex waveform or as a precursor to provide information for further Harmonic Adjustment and/or Synthesis. This is especially true if the analysis is to be done quasi-real time.

The sound file and complex waveform is also processed for signal shredding. This may include the fast find fundamental routine or different routines. The shredded signals can then be processed by the following steps of harmonic adjustment, harmonic synthesis, harmonic accentuations and harmonic transformation. The harmonic adjustment , harmonic synthesis, the harmonic accentuation and harmonic transformation allows improvement of the shredded signal and repair of its content based on the shredding process and further increases the identification of the signal source.

Harmonic Adjustment and/or Synthesis is based on a moving target or modifying devices being adjustable with respect to amplitude and frequency. In an offline mode, the Harmonic Adjustment/Synthesis would receive its input directly from the sound file. The output can be just from Harmonic Adjustment/Synthesis.

Alternatively, Harmonic Adjustment Synthesis signal in combination with any of the separating Harmonics for Effects, Interpolation or Imitating Natural Harmonics may be provided as an output signal.

Harmonic Actuation based on moving targets may also receive an input signal off-line directly from the input of the sound file of complex waveforms or as an output form the Harmonic Adjustment and/or Synthesis. It provides an output signal either out of the system or as a input to Harmonic Transformation. The Harmonic Transformation is based as well as on moving target and includes target files, interpolation and imitating natural harmonics.

The description of the invention has been explained with respect to a musical instrument. It also can be used as follows:

Echo canceling

Voice printing and signature printing
- Automated identification
- Secure voice recognition
- Limited bandwidth repair
- Data compression Eavesdropping Overall communication
- Intelligibility enhancement Erasing
- Noise reduction and elimination Video imaging Any wave based technology Out of phase noise cancellation in submarines, aircraft, loud environments, etc.

Wing flutter cancellation in jet fighters

Oscillation cancellation in anything including heavy machinery, airplanes, etc.

Signal encryption

Also, the method of the present invention is not limited to audio signals, but may be used with any frequency signals.

The present invention has been described in words such that the description is illustrative of the matter. The description is intended to describe the present invention rather than in a manner of limitation. Many modifications, combinations, and variations are possible of the methods provided above. It should therefore be understood that the invention may be practiced in ways other than specifically described herein.

What is claimed:

1. A method of shredding a signal of a single source from a composite signal comprising:

a) generating a first file as a function of time, of energy levels for each frequency and rate of change of energy for each frequency form the composite signal;

b) determining from the first file lowest frequency having sustained or repeated energy;

c) determining from the first file uninterrupted sequence of the lowest frequency energies and the start time, end time, starting energy and decay ratio of each sequence;

d) determine harmonics of the lowest frequency and estimate energy as a function of time;

e) remove the lowest frequency and the determined harmonics from the first file and store in a second file as a signal from a first single source and store the remaining portion of the first file in a third file; and f) repeating steps b through e on the third file to determining a signal of other single sources.

2. The method of claim 1 wherein step d is from a file of harmonic frequencies of different sources.

3. The method of claim 1 wherein step d is an iterative process using the lowest frequency, the energy ratios of the harmonic and the energy decay ratio for each harmonic.

4. The method of claim 1 wherein step d includes selecting math harmonics, math harmonics plus chaos harmonics or chaos harmonics.

5. The method of claim 1 including determining rhythm patterns from the start times of the uninterrupted sequence of the lowest frequency.

6. The method of claim 1 wherein step d includes determining one or more harmonic content, resonance bands, frequency bands, overall frequency ranges, fundamental frequency range and overall resonance band characteristic of the first file.

* * * * *